US009711886B2

(12) United States Patent
Williamson

(10) Patent No.: US 9,711,886 B2
(45) Date of Patent: Jul. 18, 2017

(54) SD CARD ACCESS DOOR

(71) Applicant: Honeywell International Inc., Morristown, NJ (US)

(72) Inventor: Daniel Williamson, Powhatan, VA (US)

(73) Assignee: Honeywell International Inc., Morris Plains, NJ (US)

( * ) Notice: Subject to any disclaimer, the term of this patent is extended or adjusted under 35 U.S.C. 154(b) by 101 days.

(21) Appl. No.: 14/673,779

(22) Filed: Mar. 30, 2015

(65) Prior Publication Data

US 2016/0294084 A1 Oct. 6, 2016

(51) Int. Cl.
*H05K 7/20* (2006.01)
*H01R 13/447* (2006.01)
*H01R 13/46* (2006.01)

(52) U.S. Cl.
CPC ......... *H01R 13/447* (2013.01); *H01R 13/465* (2013.01)

(58) Field of Classification Search
CPC ............... H05K 5/0204; H05K 5/0208; H05K 7/1462–7/1484
See application file for complete search history.

(56) References Cited

U.S. PATENT DOCUMENTS 5,212,347 A * 5/1993 Powers .................... H02G 3/14 174/67
5,659,705 A * 8/1997 McNutt ................ G05B 19/056 365/221
5,802,389 A * 9/1998 McNutt ................ G05B 19/054 710/1
5,934,919 A * 8/1999 Cross ................. H01R 13/6395 439/136
5,964,599 A * 10/1999 Choi ..................... G06F 1/1616 361/679.4
6,097,303 A * 8/2000 Lunz ........................ G05B 9/03 340/3.42
6,172,875 B1 * 1/2001 Suzuki .................... G06F 1/183 361/679.4
7,242,116 B2 * 7/2007 Kawazu ............... G05B 19/058 307/326
7,305,535 B2 12/2007 Harari et al.
(Continued)

OTHER PUBLICATIONS

U.S. Appl. No. 14/673,705, filed Mar. 30, 2015.
(Continued)

*Primary Examiner* — Anthony Q Edwards
(74) *Attorney, Agent, or Firm* — Seager, Tufte & Wickhem, LLP

(57) ABSTRACT

An apparatus for installing or replacing license software such as in a device or secure digital card of a controller. The apparatus may have a door that is situated in a base of the controller. The door may slide down to provide an opening that permits access to a place, an area or receptacle that holds the card. The door may not necessarily be open-able until the controller is removed from a panel, a din rail, or some other structure, where a removal of power has to occur. The door may be designed so that it blends in with the base in that just qualified installers are aware of how to find the door for access to the card. To close the door, the card needs to be fully installed before the door can be closed. The door may be designed with hook features to prevent its removal from the controller base.

19 Claims, 26 Drawing Sheets

(56) References Cited

U.S. PATENT DOCUMENTS

| | | | | |
|---|---|---|---|---|
| 7,845,953 | B2 * | 12/2010 | Brock | H01R 13/5213 439/136 |
| 8,218,314 | B2 * | 7/2012 | Yang | H01R 13/5213 361/679.01 |
| 8,563,859 | B1 * | 10/2013 | Baldwin | H02G 3/14 174/53 |
| 8,769,158 | B2 * | 7/2014 | Kretschmann | G05B 19/058 370/222 |
| 8,902,607 | B1 * | 12/2014 | Chang | G01R 31/2834 349/57 |
| 9,048,557 | B2 * | 6/2015 | Kang | G06K 19/07732 |
| 9,089,067 | B2 * | 7/2015 | Gaub | H05K 7/1478 |
| 2005/0191885 | A1 * | 9/2005 | Son | H01R 13/447 439/135 |
| 2007/0297148 | A1 * | 12/2007 | Gaub | H05K 7/1478 361/728 |
| 2010/0240326 | A1 * | 9/2010 | Balcon | H02B 1/044 455/90.3 |
| 2013/0171845 | A1 * | 7/2013 | Neukam | G06F 1/181 439/135 |
| 2014/0120752 | A1 * | 5/2014 | Cheng | H01R 13/447 439/136 |
| 2014/0139981 | A1 * | 5/2014 | Kuo | G06F 1/1656 361/679.01 |
| 2016/0091903 | A1 * | 3/2016 | Patton | F23N 5/203 700/276 |

OTHER PUBLICATIONS

U.S. Appl. No. 14/673,742, filed Mar. 30, 2015.

Distech Controls, “Eclypse Connected System Controller Data Sheet,” 12 pages, 2014.

Distech Controls, “It’s Time You Experienced Eclypse,” 16 pages, 2014.

Wikipedia, “Pearson Hashing,” 4 pages, downloaded Mar. 26, 2015.

* cited by examiner

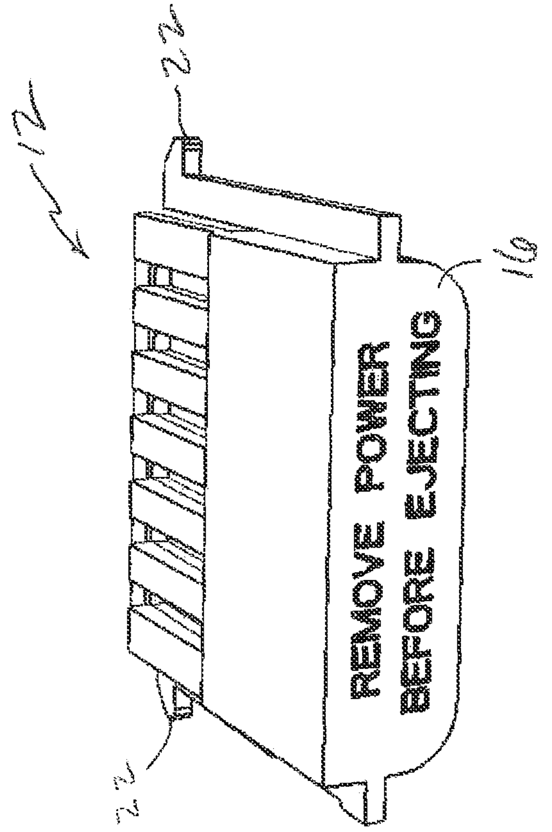
FIGURE 13

SD CARD ACCESS DOOR

BACKGROUND

The present disclosure pertains to controllers and to controllers having device cards.

SUMMARY

The disclosure reveals an apparatus for installing or replacing license software such as in a software device or secure digital (SD) card of a controller. The apparatus may be a door that is situated in a base of the controller. The door, for instance, may slide down to provide an opening that permits access to an area or receptacle that holds the SD card. The door may not necessarily be open-able until the controller is removed from a panel, a din rail, or some other structure, where a removal of power has to occur. The door may be designed so that it blends in with the base in that just qualified installers are aware of how to find the door for access to the SD card. To close the door, the SD card needs to be fully installed be the door can be closed. The door may be designed with hook features to prevent its removal from the controller base.

BRIEF DESCRIPTION OF THE DRAWING

FIG. 13 is a diagram of a view showing a warning message on the bottom of the door;

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

A need appears to provide and easy means of installing or replacing license software in Titan™ controllers. At the same time, an approach of installation may provide some level of tamper proof and force an installer to remove power from unit to prevent damage.

The present apparatus may be a plastic door that grants access to a software device or secure digital (SD) card. The door may slide down in the plastic base but only open fully when the controller unit is removed from a panel or din rail. This may force the installer to remove the unit thereby removing power. The door may blend in with the base plastic so that only qualified installers are aware of the access.

The door design may have hook features that engage during assembly which prevent the door from being removed from the base. The software medium may have to be fully installed before the door is allowed to close and unit is reinstalled.

Figure 1:
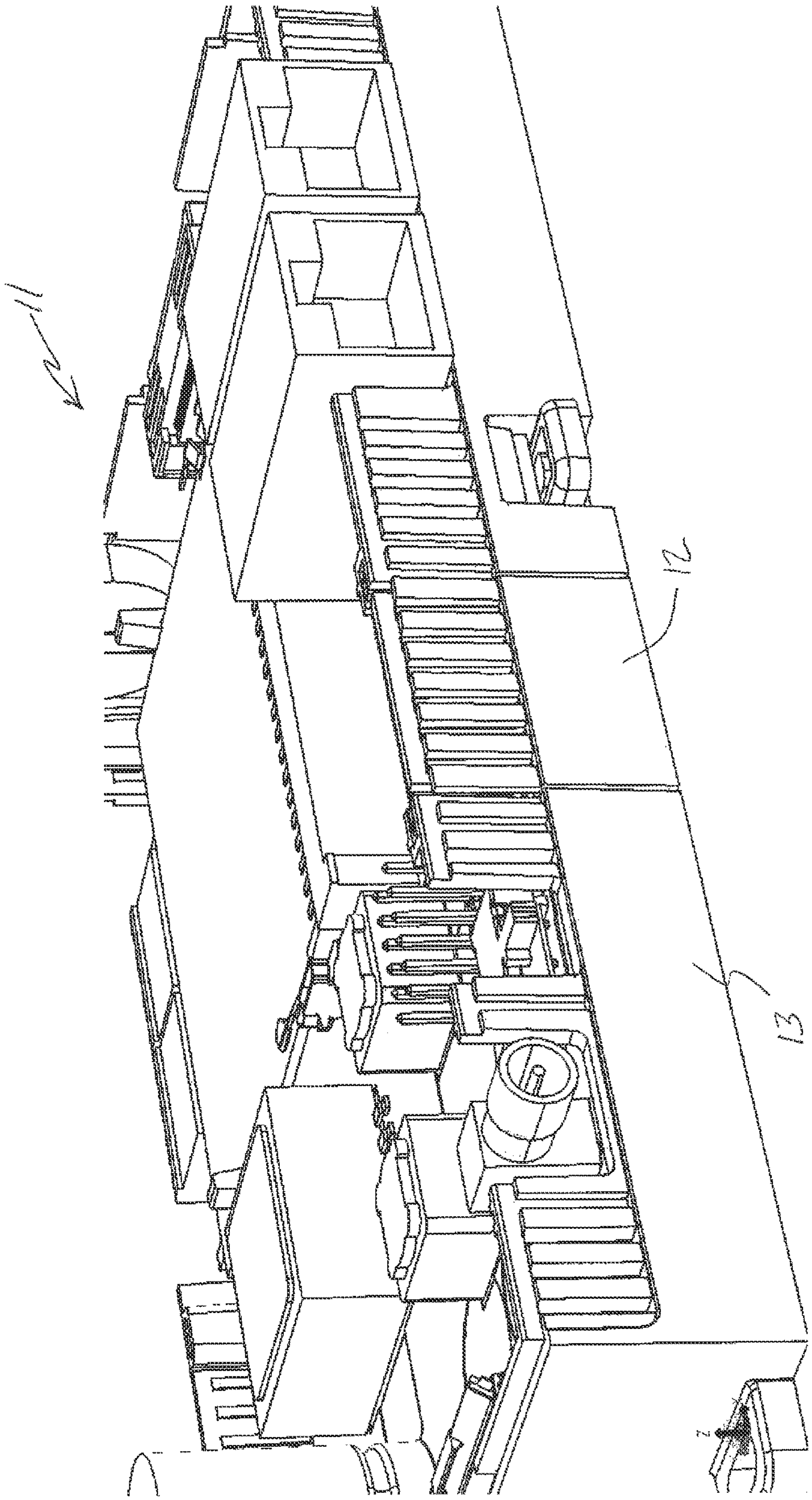
FIG. 1 is a diagram of a controller having a component access door integrated into a base of the controller.

FIG. 1 is a diagram of a controller 11 having a component access door 12 integrated into a base 13 of the controller. Door 12 appears closed in FIG. 1, and covers an entry to a receptacle 14 for an SD card, software medium, or other component which may not necessarily be accessible. A top portion of the case or cover of the controller may be removed for illustrating an operation and advantages of access door 12.

So in order to remove or exchange the SD card or other component, access door 12 has to be opened in order to get to the receptacle. Controller 11 and its base 13 are designed in a fashion to prevent access door 12 from being opened sufficiently to get to the card for reasons of removal or exchange, unless power to controller 11 has been removed.

Figure 2:
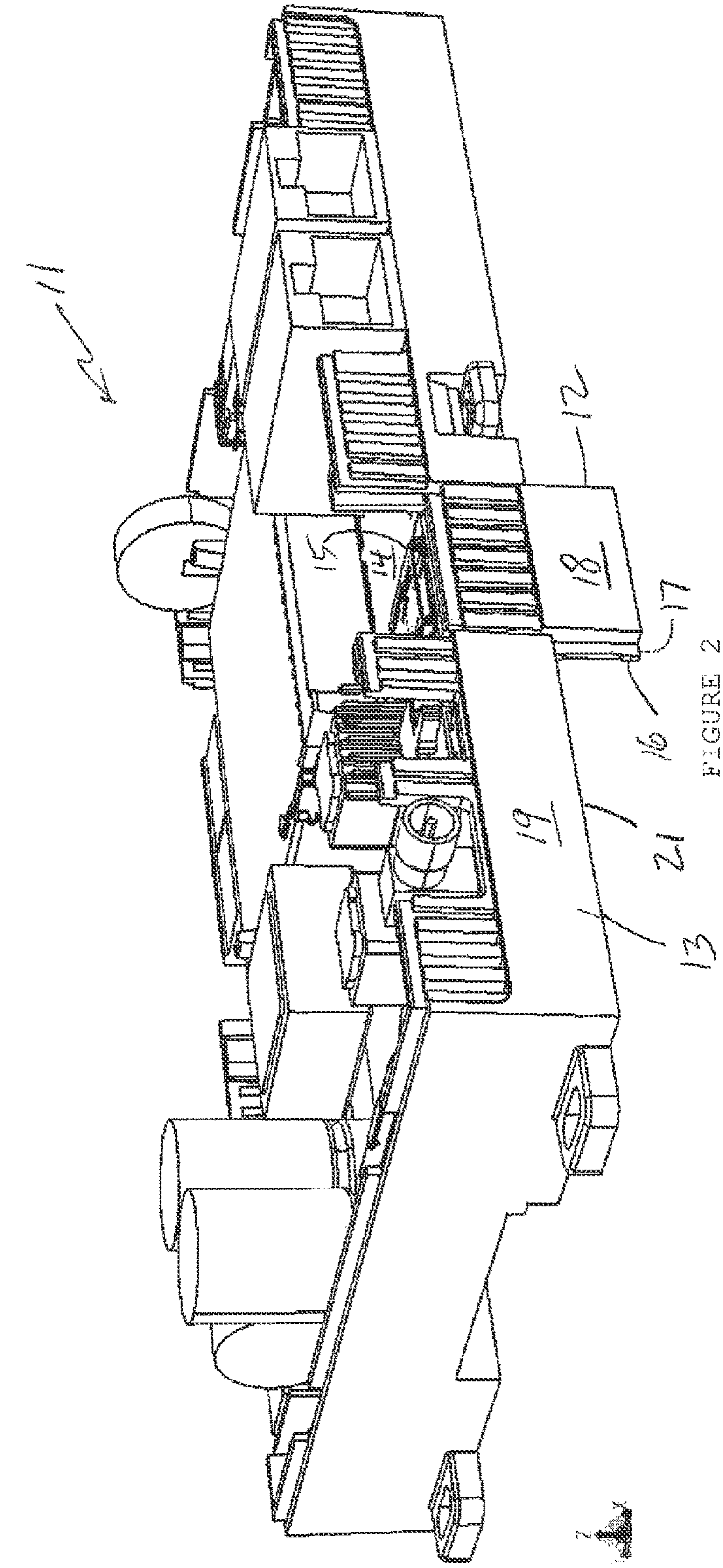
FIG. 2 is a diagram of a controller showing an opened access door.

FIG. 2 is a diagram of controller 11 showing an opened access door 12. As indicated herein, power to controller 11 is to be removed prior to opening door 12 for access to receptacle 14. An example may incorporate a situation where door 12 may slide down the controller base 13 for access to receptacle 14 sufficient for removal or insertion of the SD card 15 or other component, that can occur when controller 11 is removed from a panel or din rail. Other designs may be incorporated for preventing adequate access to component 15 in receptacle 14 before power is removed from controller 11.

Door 12 may have an appendage 16 at the bottom of door 12. Appendage 16 may have an external surface 17 that is at about a 90 degree angle relative to an external surface 18 of door 12. The external surface 18 may match up with an external surface 19 of controller base 13 so that a transition between surfaces 18 and 19 appears smooth to a touch and visually. The material and color of surfaces 18 and 19 may be the same to an extent where door 12 blends in with controller base 13 in that only qualified installers will be aware of access door 12. Appendage 16 may have a shape different than that which is shown.

Similarly, when access door 12 is closed, surface 17 of appendage 16 may match up with a bottom surface 21 of controller base 13 such that a transition between surfaces 17 and 21 appear smooth to a person's touch and visual senses. There may be a warning on bottom of door 12 to remove power before ejecting. The material of door 12 and controller base 13 may be, for example, a plastic.

Figure 3:
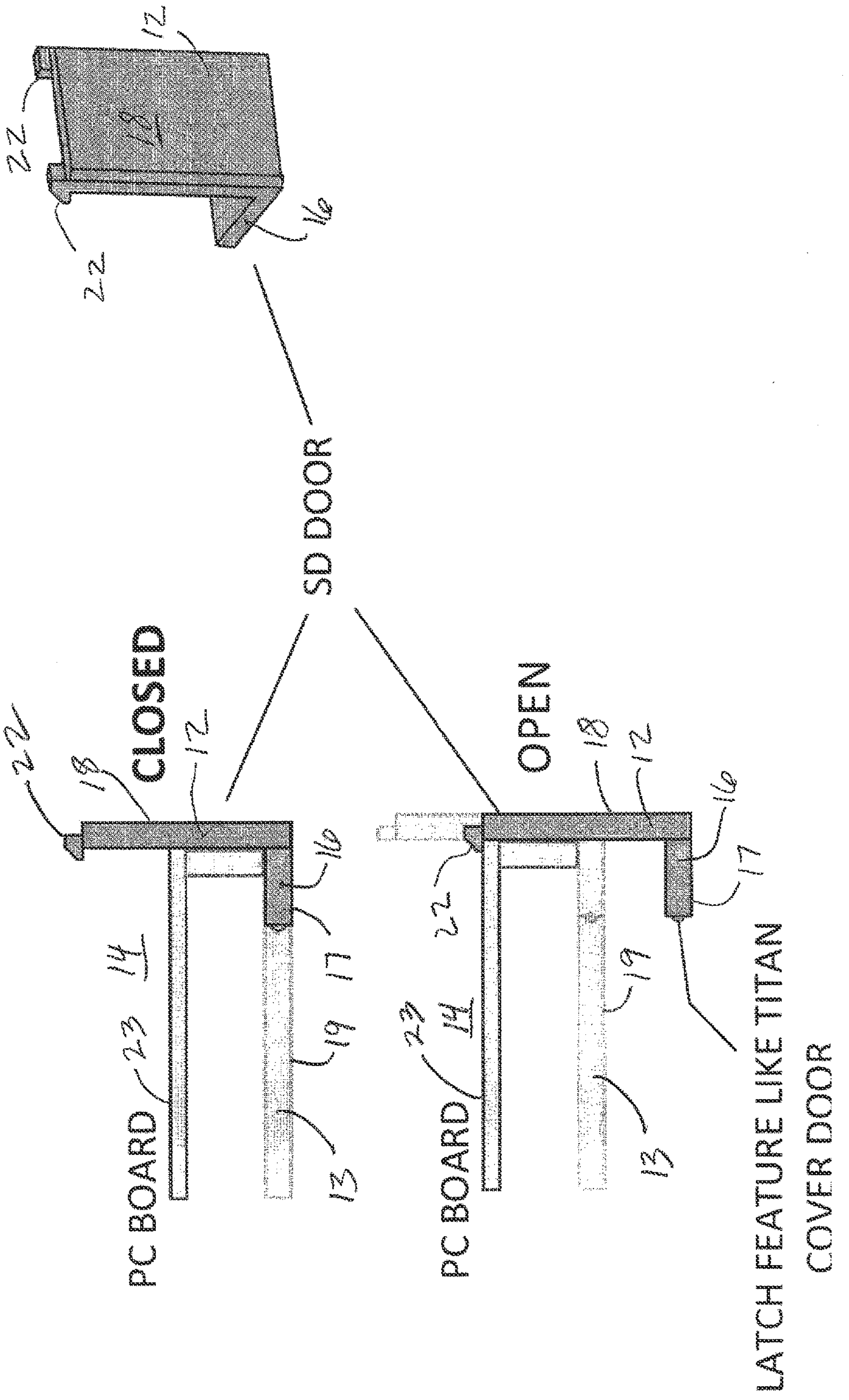
FIG. 3 is a diagram showing side views of the access door on a controller base and a perspective view of the access door not on the controller base.

FIG. 3 is a diagram showing side views of access door 12 on controller base surface 19 and a perspective view of access door 12 not necessarily on controller base surface 19. Door 12 may have hooks 22 that engage during assembly and prevent door 12 from being removed from controller base 13. An SD card, software or medium or component 15 of FIG. 2 may have to be fully installed before door 12 is allowed to close and controller 11 be reinstalled onto a panel, din rail or the like and have power restored.

A door 12 may be slid down to provide open access to receptacle 14. Side hooks 22 may encounter a stop, as shown in the FIG. 16, to prevent farther downward movement of door 12. A slight ramp at the top of slide may help to keep door 12 in closed position. Once door 12 is installed, it may be very difficult to remove without damage to door 12 in absence of a removal tool.

PC board 23 may contain a connector for SD card, software medium or component 15. Appendage 16 may be more of a guide and mechanical support than a latch. The latching feel, when door 12 is closed, may be produced by side hooks 22.

Figure 4:
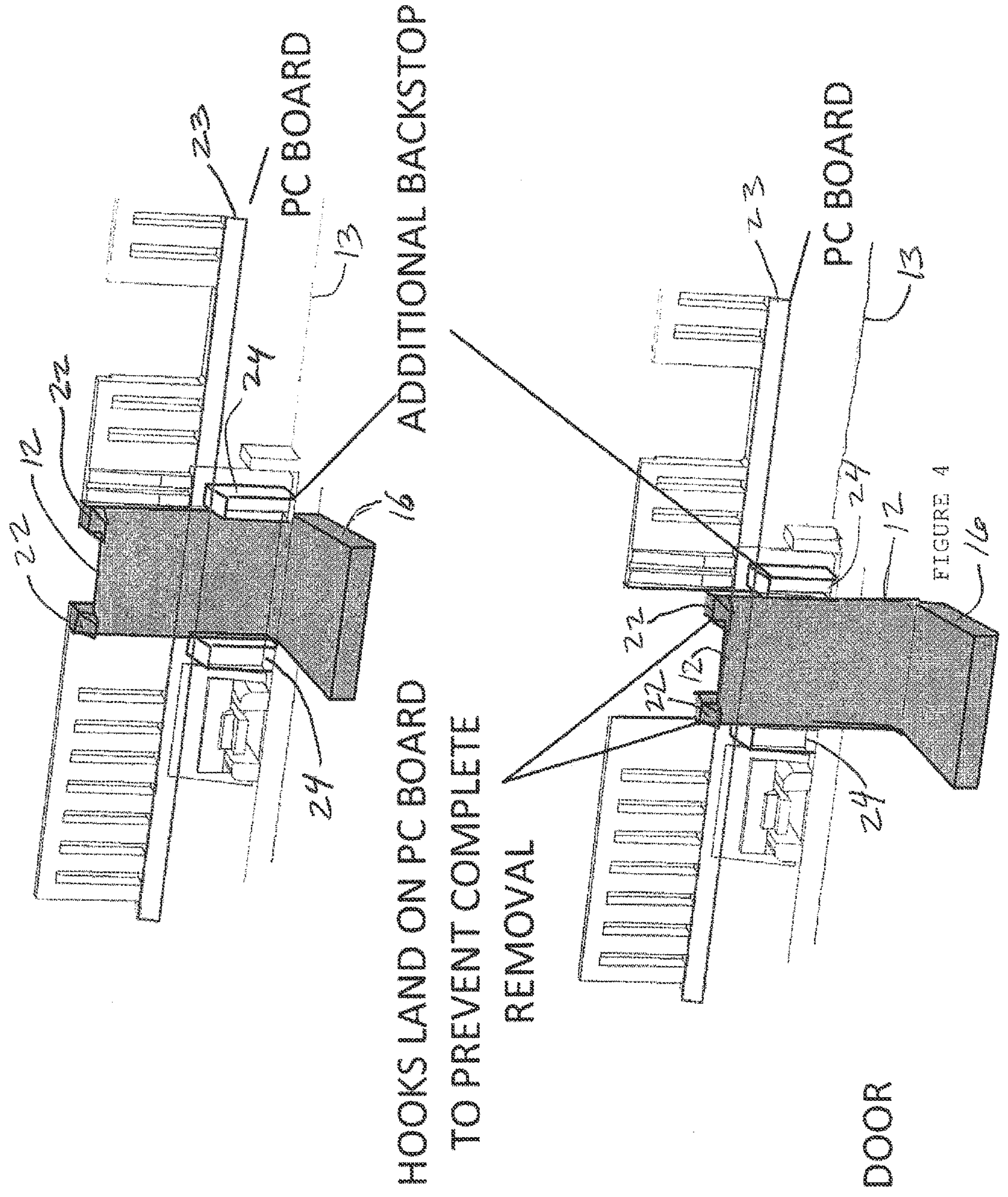
FIG. 4 is a diagram of a perspective of the door at a point of view from an inside side of the door.

FIG. 4 is a diagram of a perspective of door 12 at a point of view from an inside side of door 12. Hooks 22 may have a landing on PC board 23 to prevent complete removal of door 12. There may be additional backstops 24 for door 12.

Figure 5:
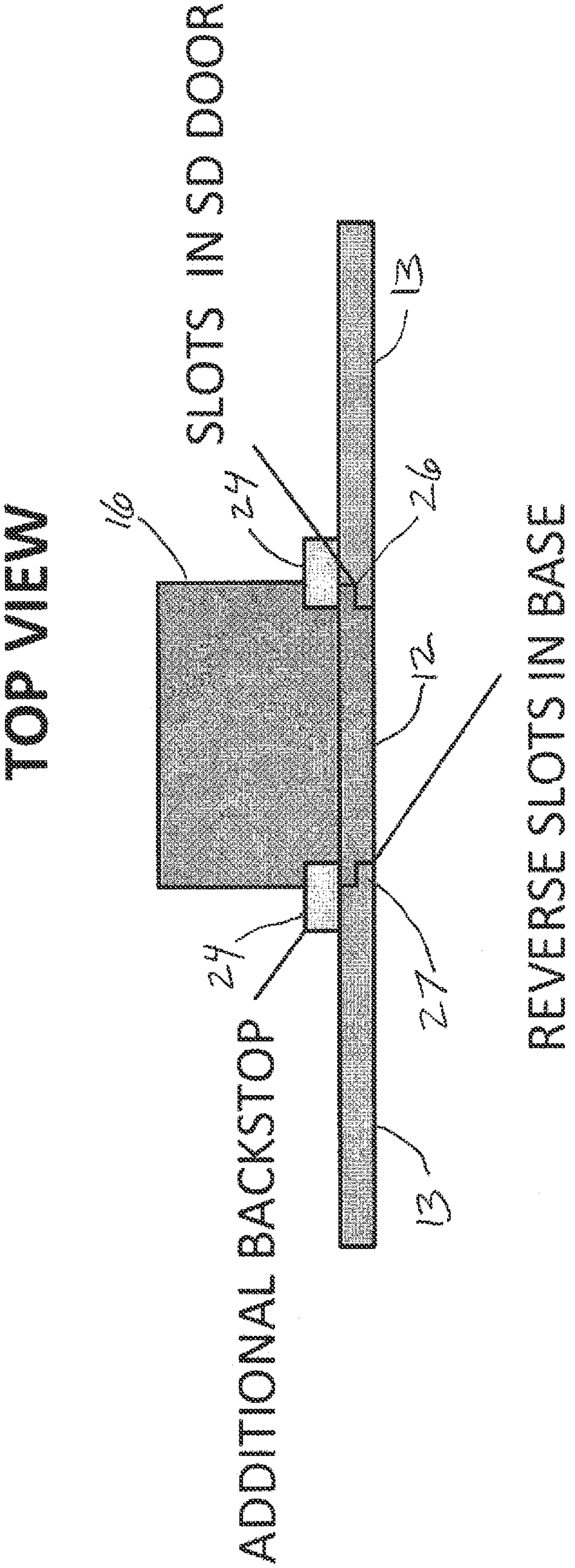
FIG. 5 is a diagram of a top view of the door and backstops.

FIG. 5 is a diagram of a top view of door 12 and backstops 24. Door 12 may have slots 26 that match up with reverse slots 27 in controller base 13. Slots 26 and 27 may provide a track for door 12 to slide up and down in the opening of base 13.

Figure 6:
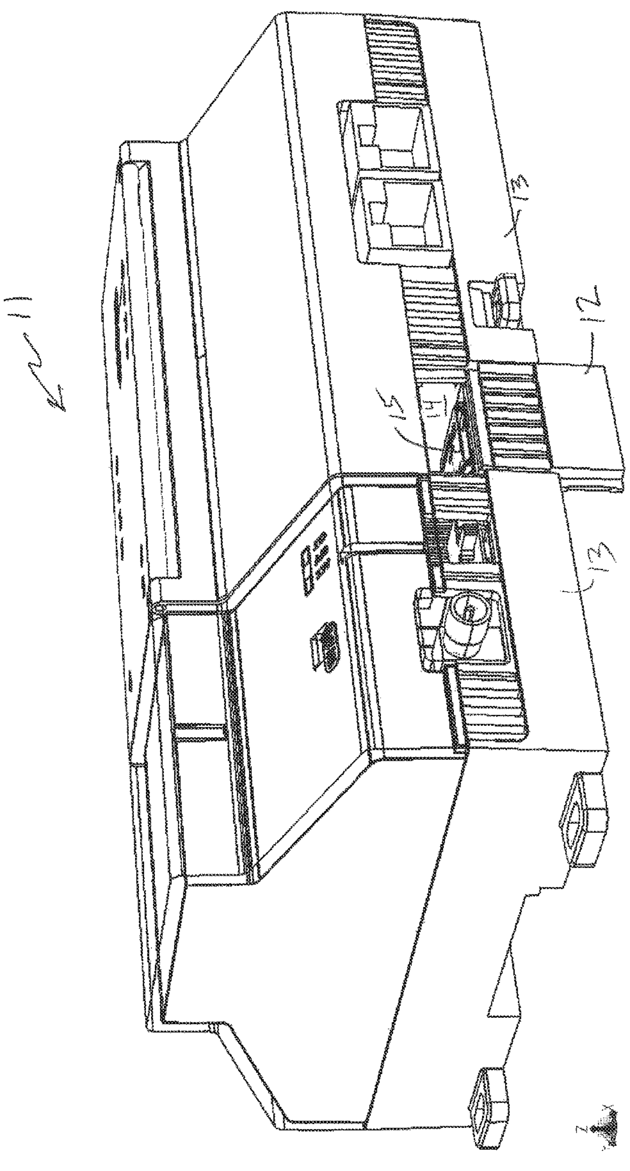
FIG. 6 is a diagram of a controller with its cover on and having an open door.
Figure 21:
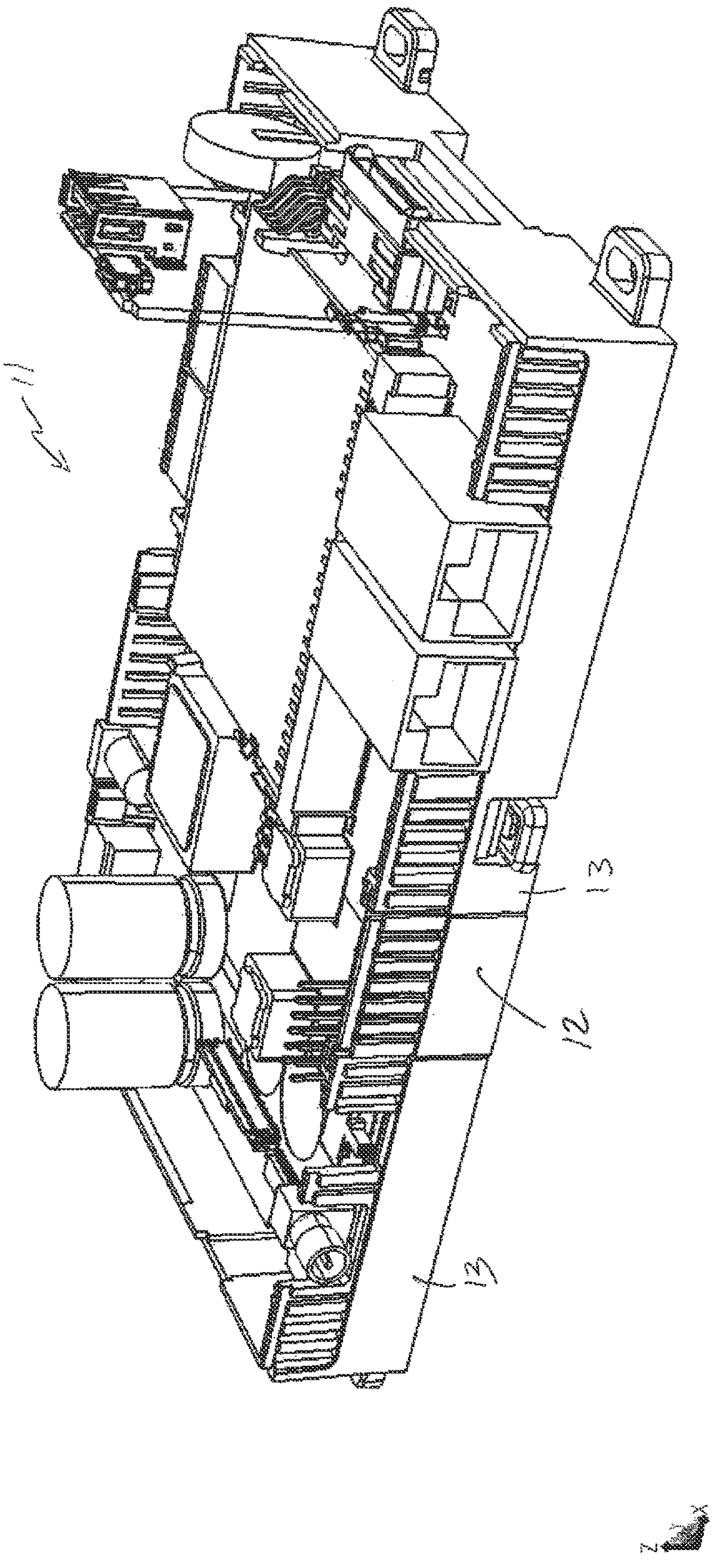
FIG. 21 is a diagram of the controller without its cover having the closed door.
Figure 22:
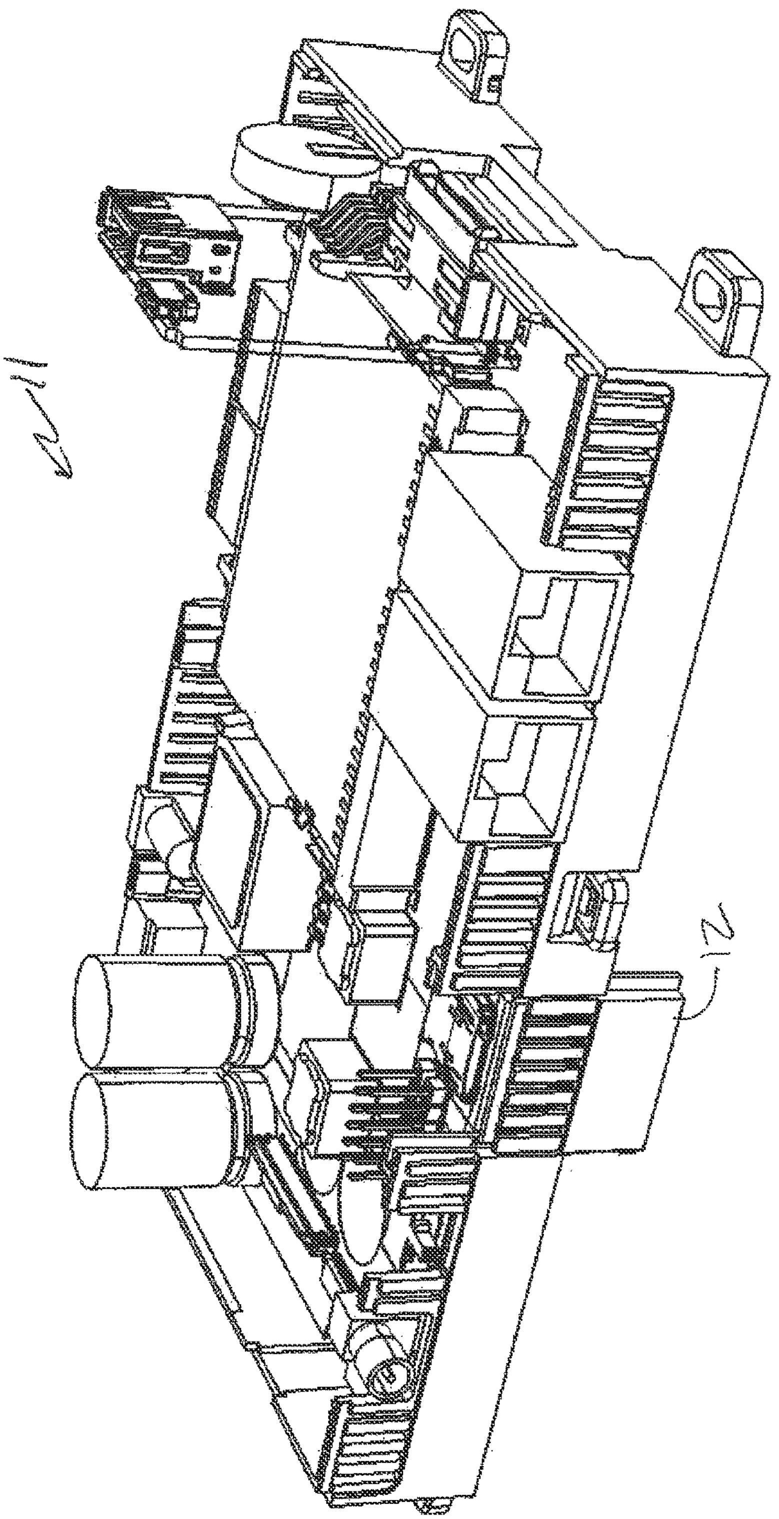
FIG. 22 is a diagram of the controller like that of FIG. 21 having the open door.
Figure 23:
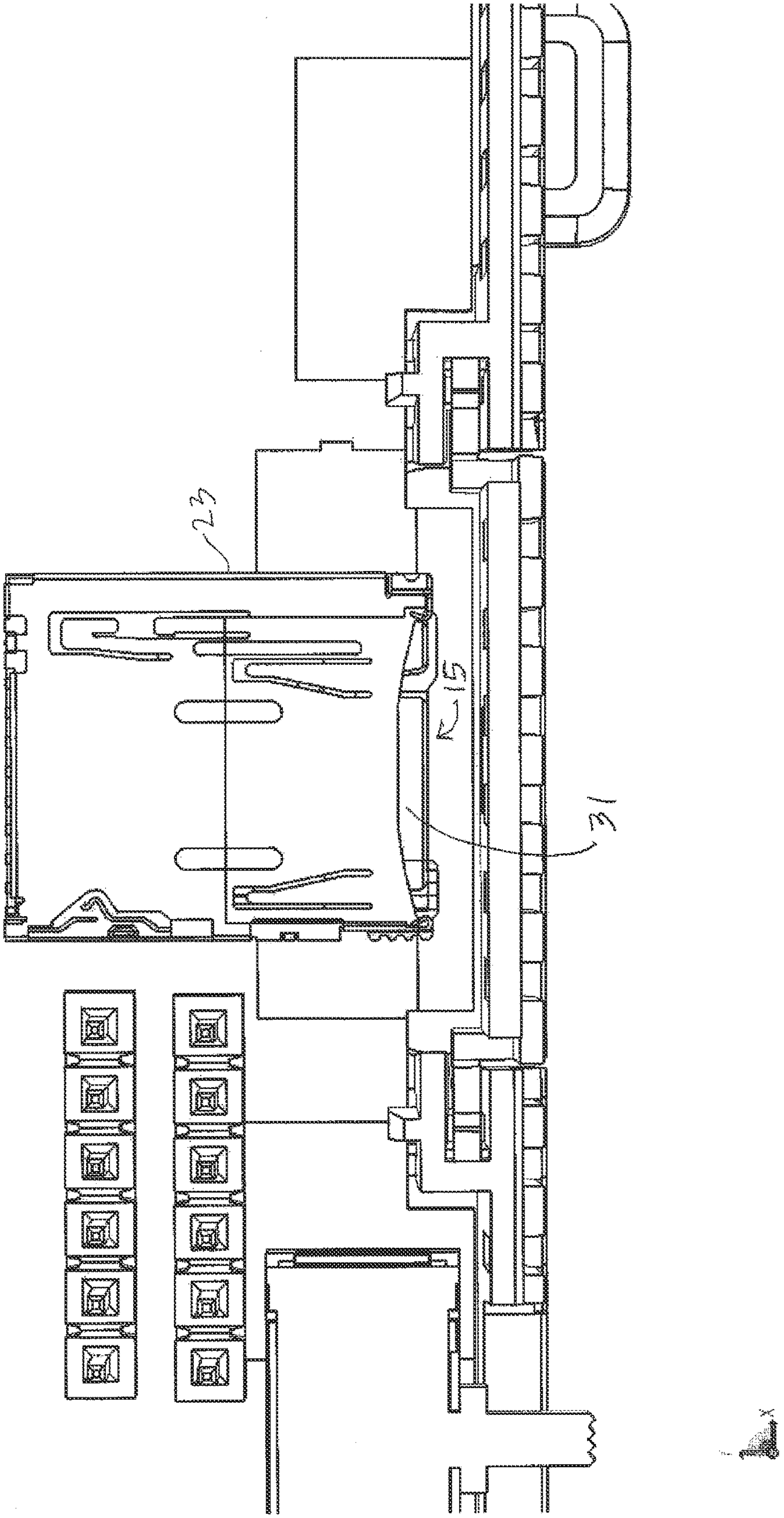
FIG. 23 is a diagram of a top view of the uncovered controller and the door.

FIG. 6 is a diagram of a Titan controller 11 with its cover on. FIG. 21 is a diagram of controller 11 with the SD card door 12 noted. FIG. 22 is a diagram of controller 11 with door 12 open. FIG. 23 is a diagram of PCB 23 notched to an edge of the SD card 15 for easy removal and around added wall thickness.

Figure 24:
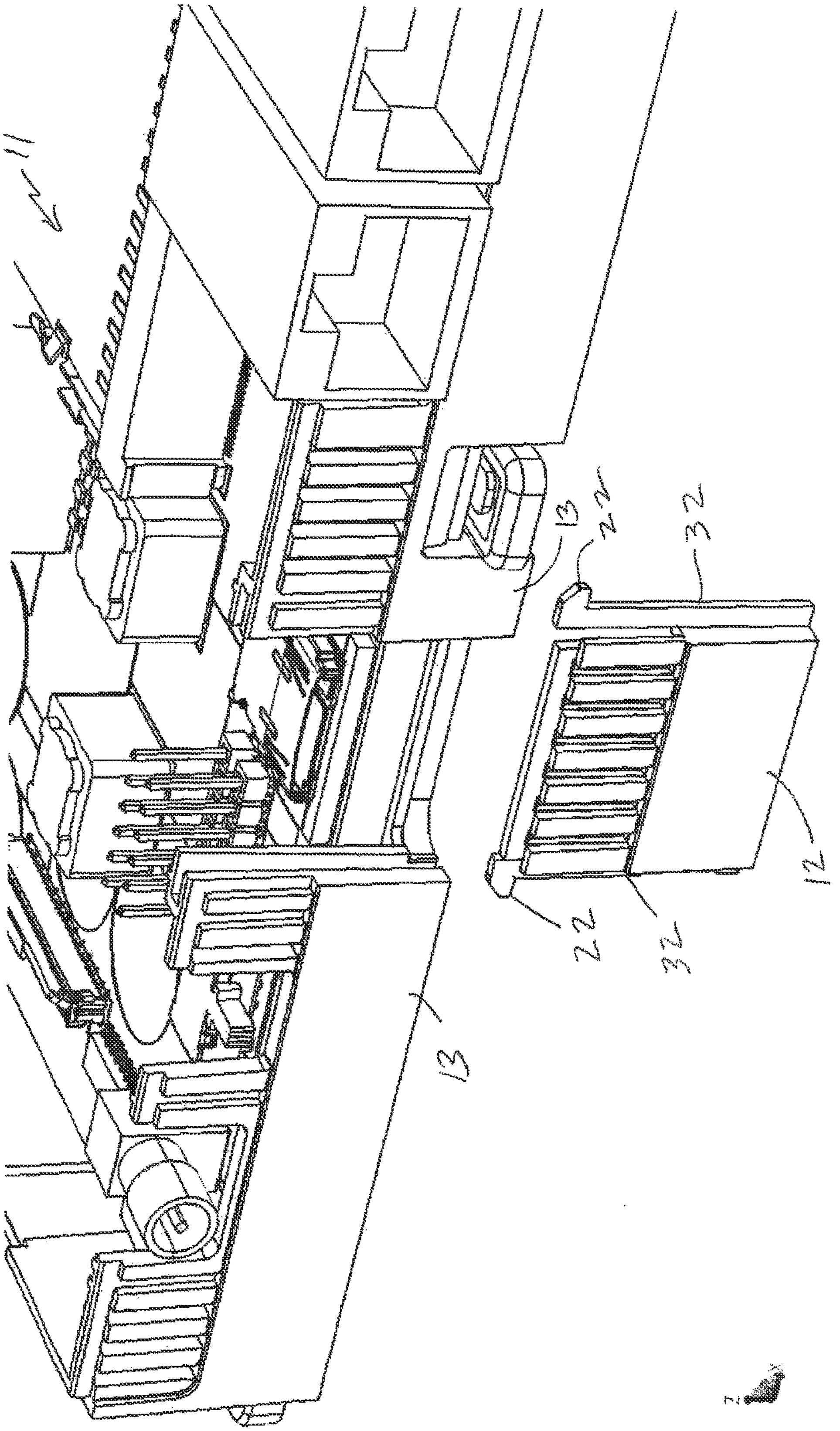
FIG. 24 is a diagram of the controller with the door in the view but apart from the controller.
Figure 25:
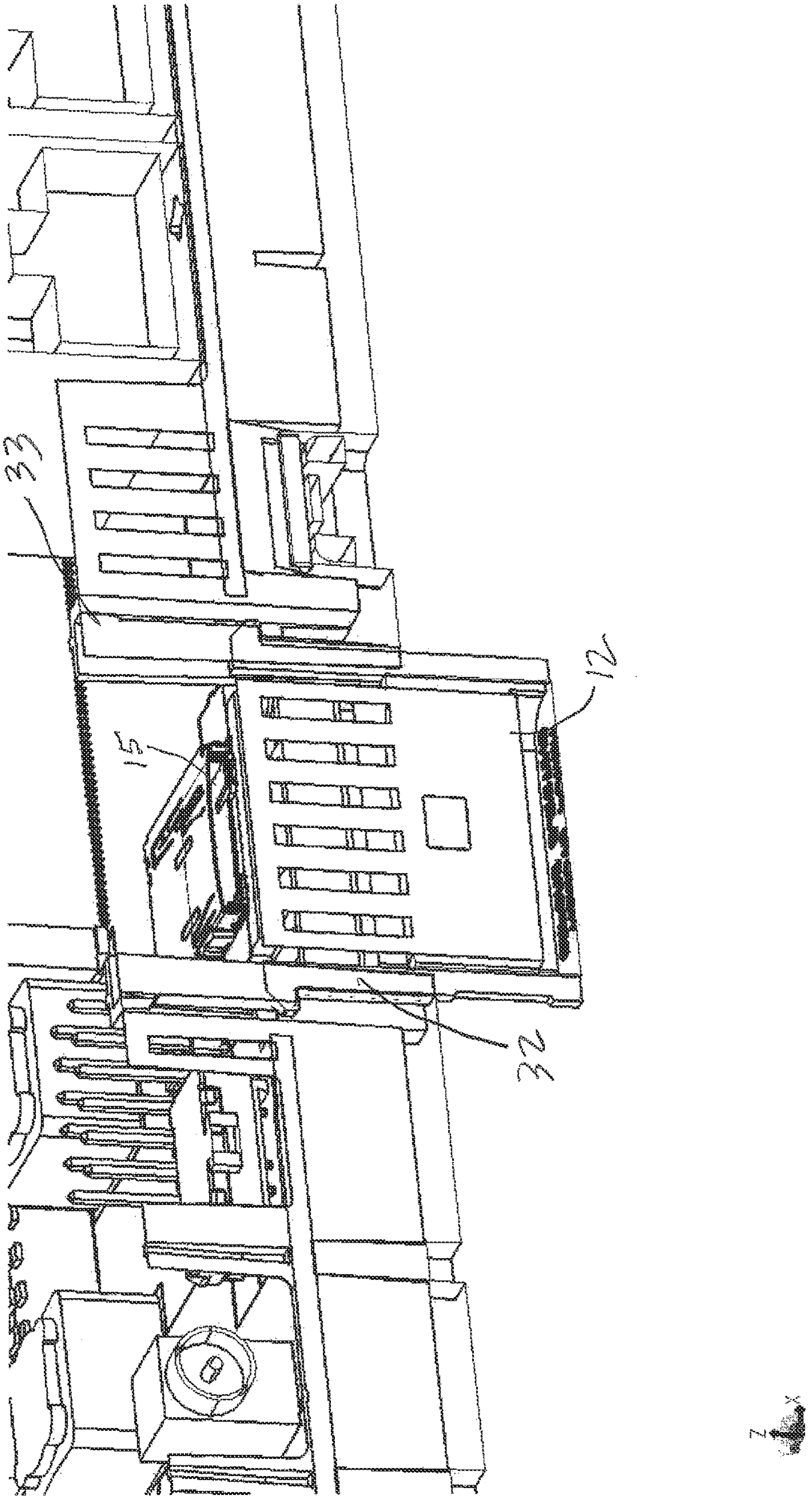
FIG. 25 is a diagram of the controller with the door partially on with the hooks being visible.

FIG. 24 is a diagram of door 12 with deflecting arms 32 with hooks 22 at the upper end of arms 32. Arms 32 permit door 12 to be assembled by sliding the door in to place from the bottom of controller base 13. FIG. 25 is a diagram showing deflecting arms 32 that may interface with a step in the tracks of slots 26 and 27, and backstops 24. A slight step 33 in a track may provide an indent for arms 32 to lightly snap into a closed position. Door 12 is not necessarily intended to be removed without a special tool if at all.

Figure 7:
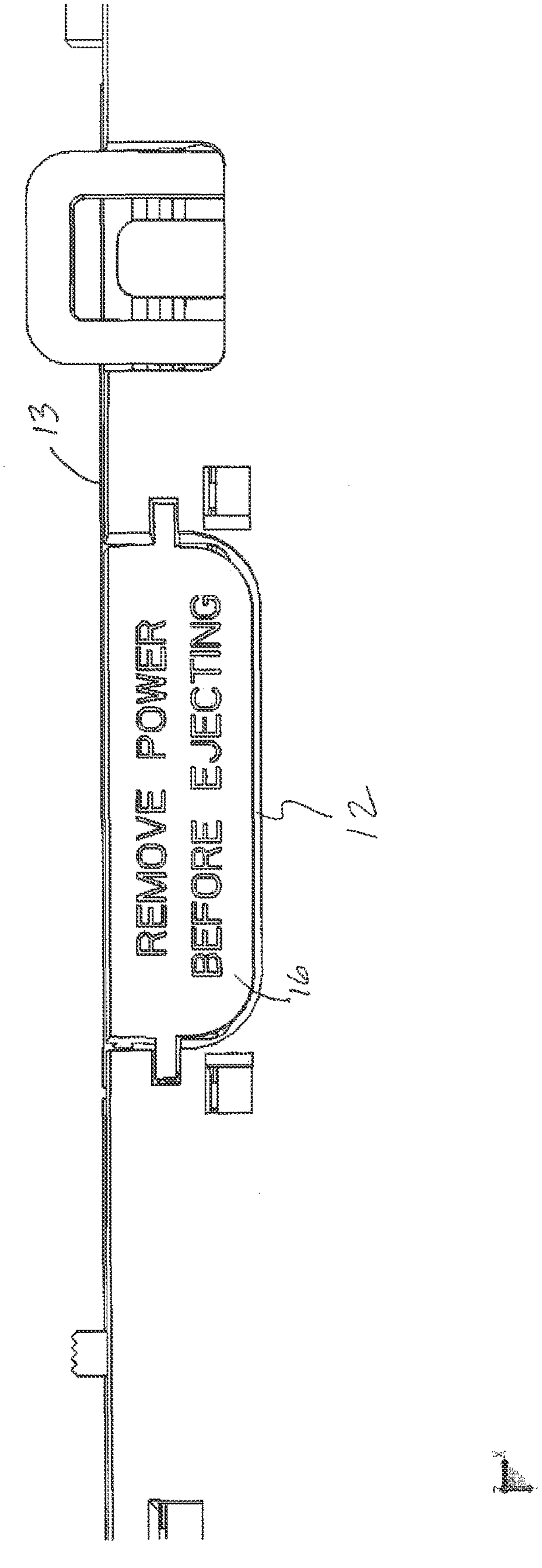
FIG. 7 is a diagram of the door with a warning to remove power before ejecting.
Figure 8:
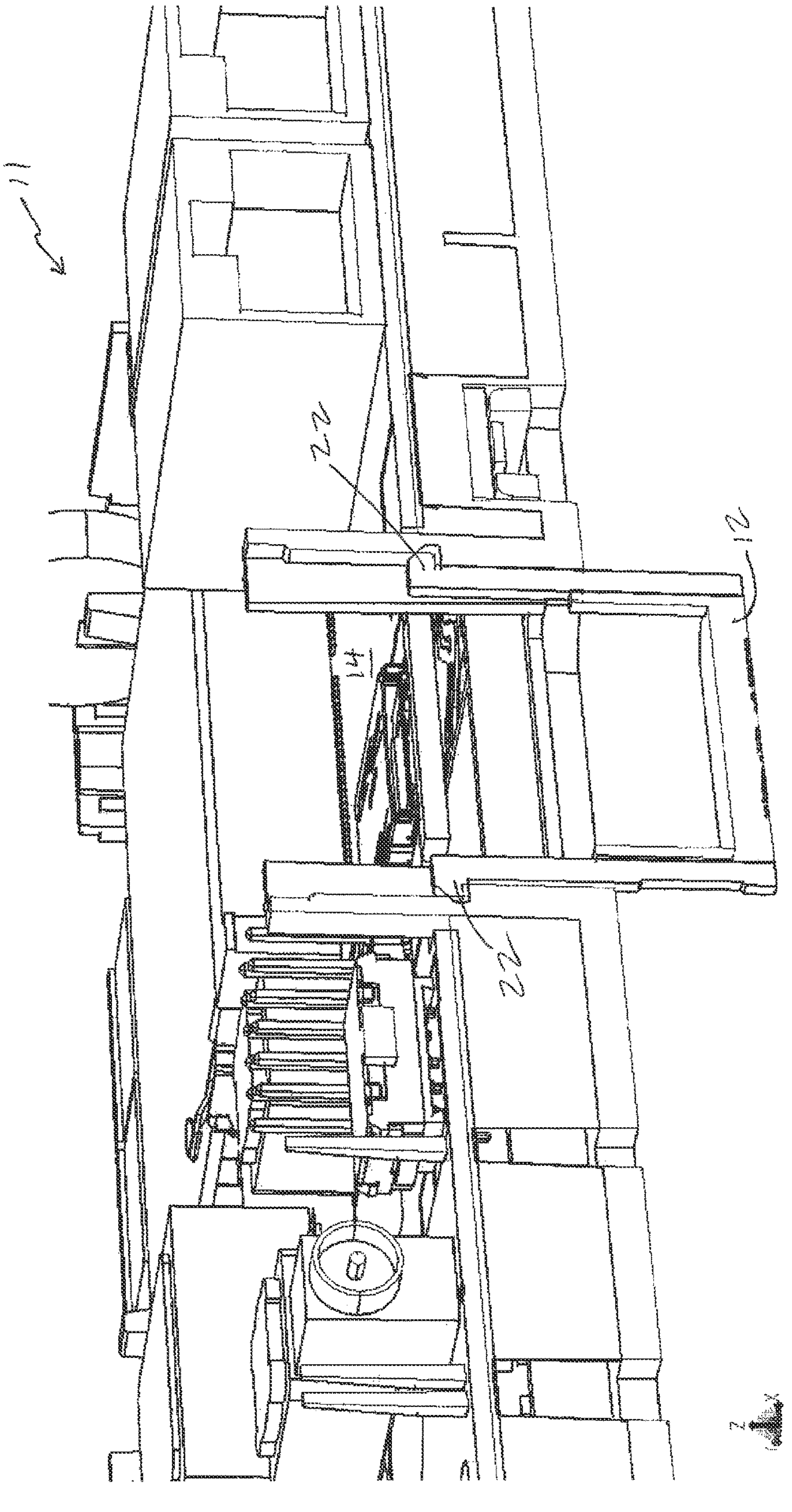
FIG. 8 is a diagram of the door in an open position on the controller.
Figure 9:
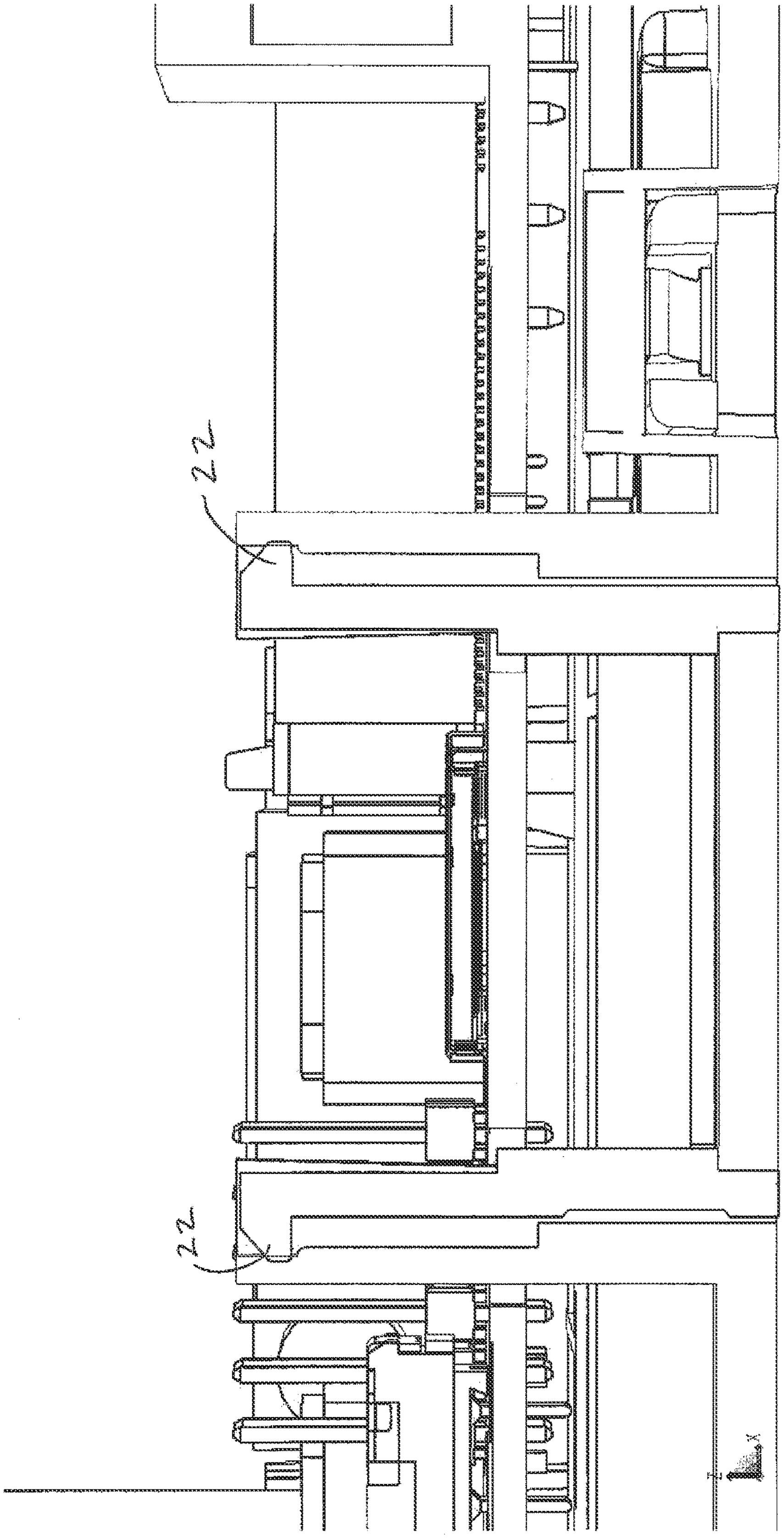
FIG. 9 is a diagram of the hooks for the door on the controller.
Figure 10:
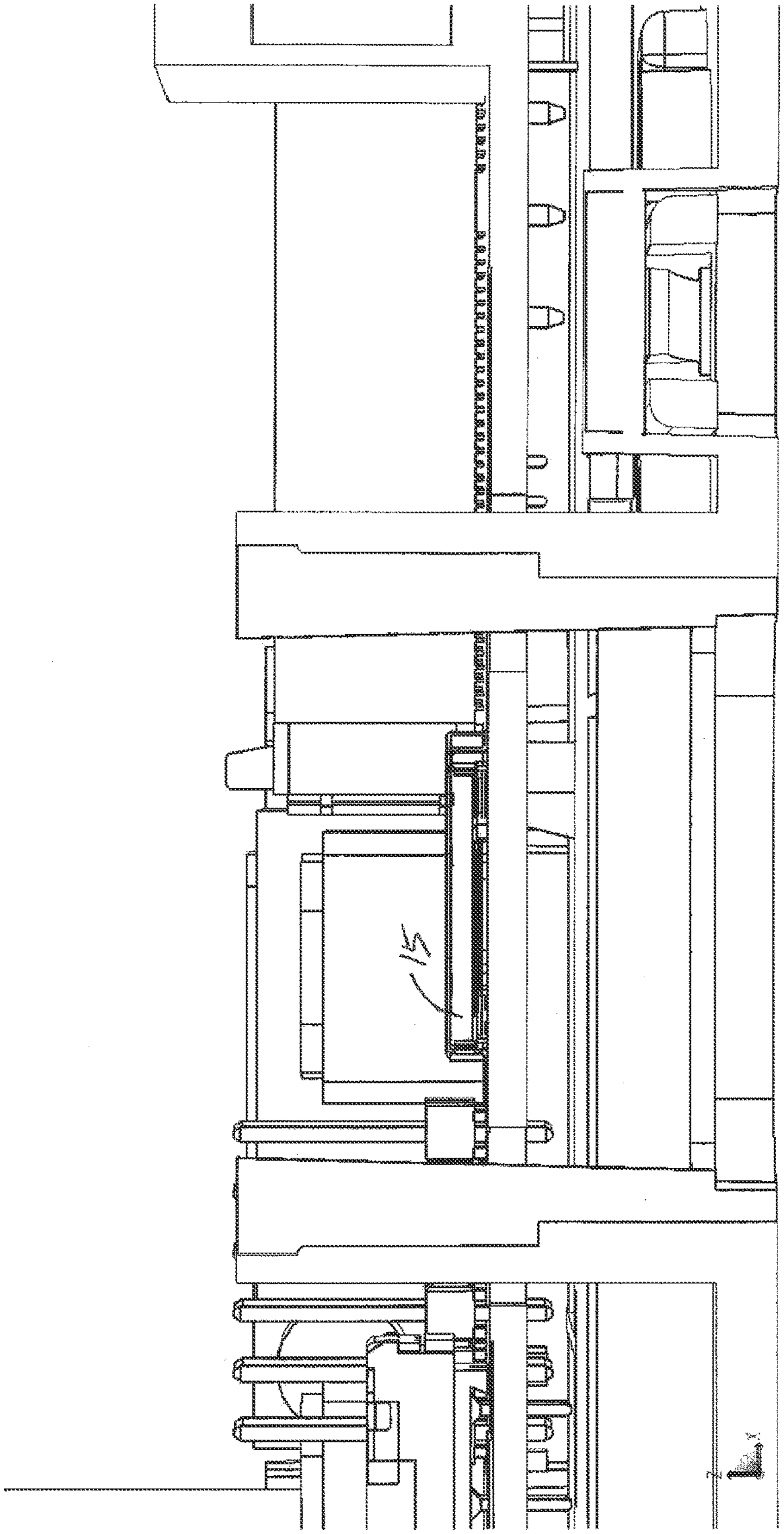
FIG. 10 is a diagram of the door opening on the controller without the hooks for the door.
Figure 11:
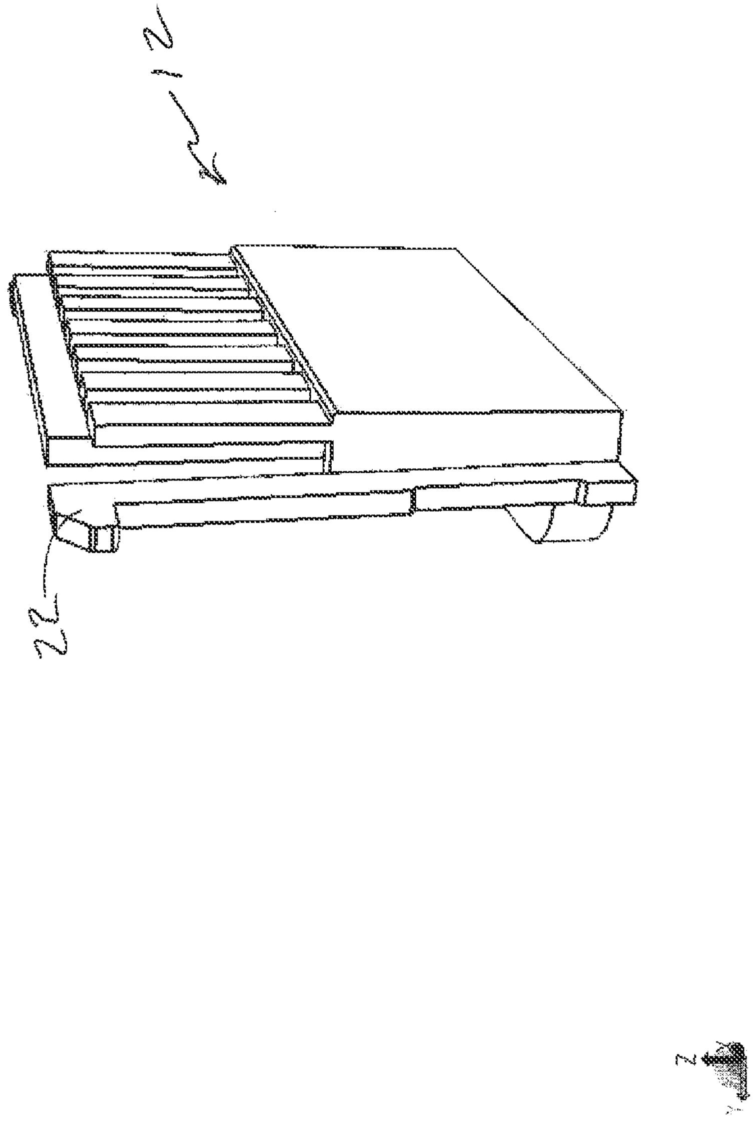
FIG. 11 is a diagram of a perspective view of the door free from the controller.
Figure 12:
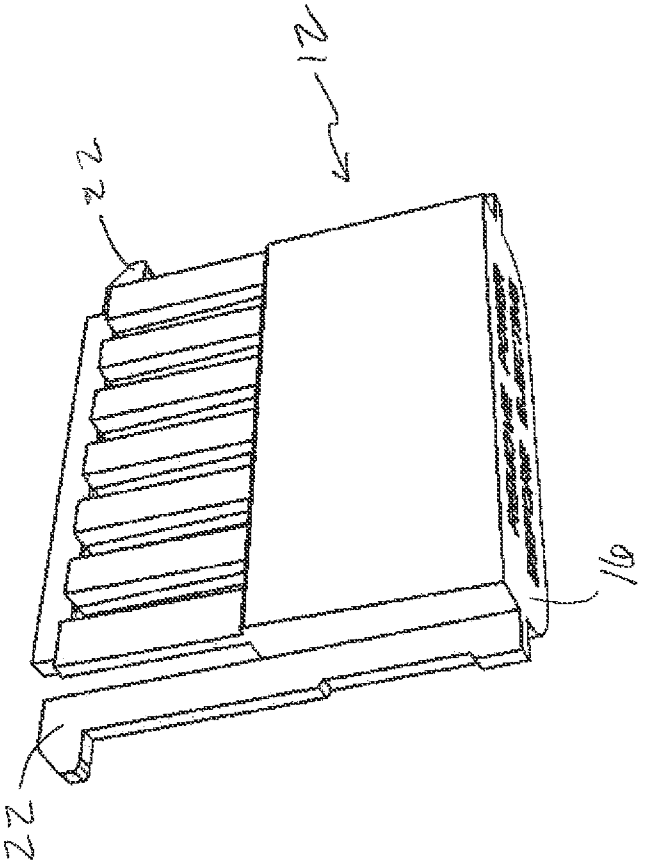
FIG. 12 is a diagram of a perspective view of the from another angle.
Figure 14:
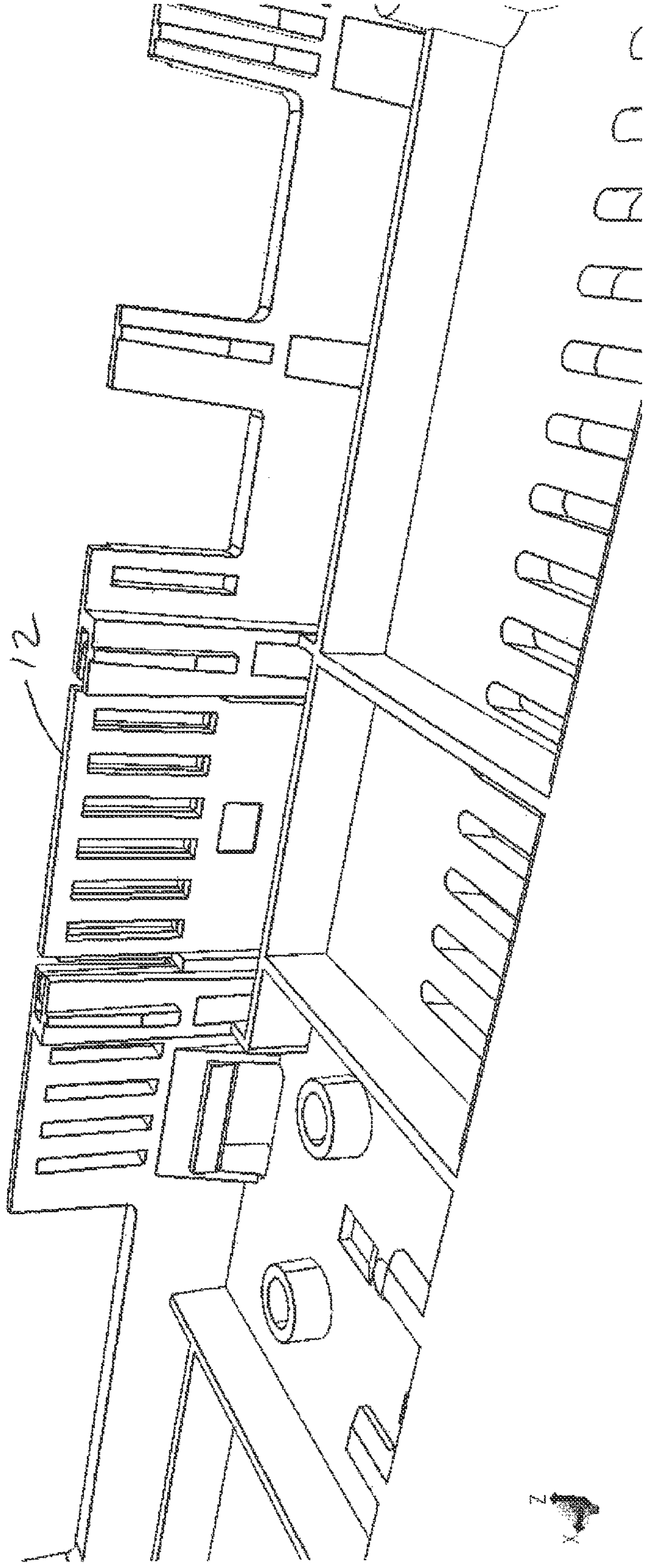
FIG. 14 is a diagram of a view from inside of the controller looking to an installed door.
Figure 15:
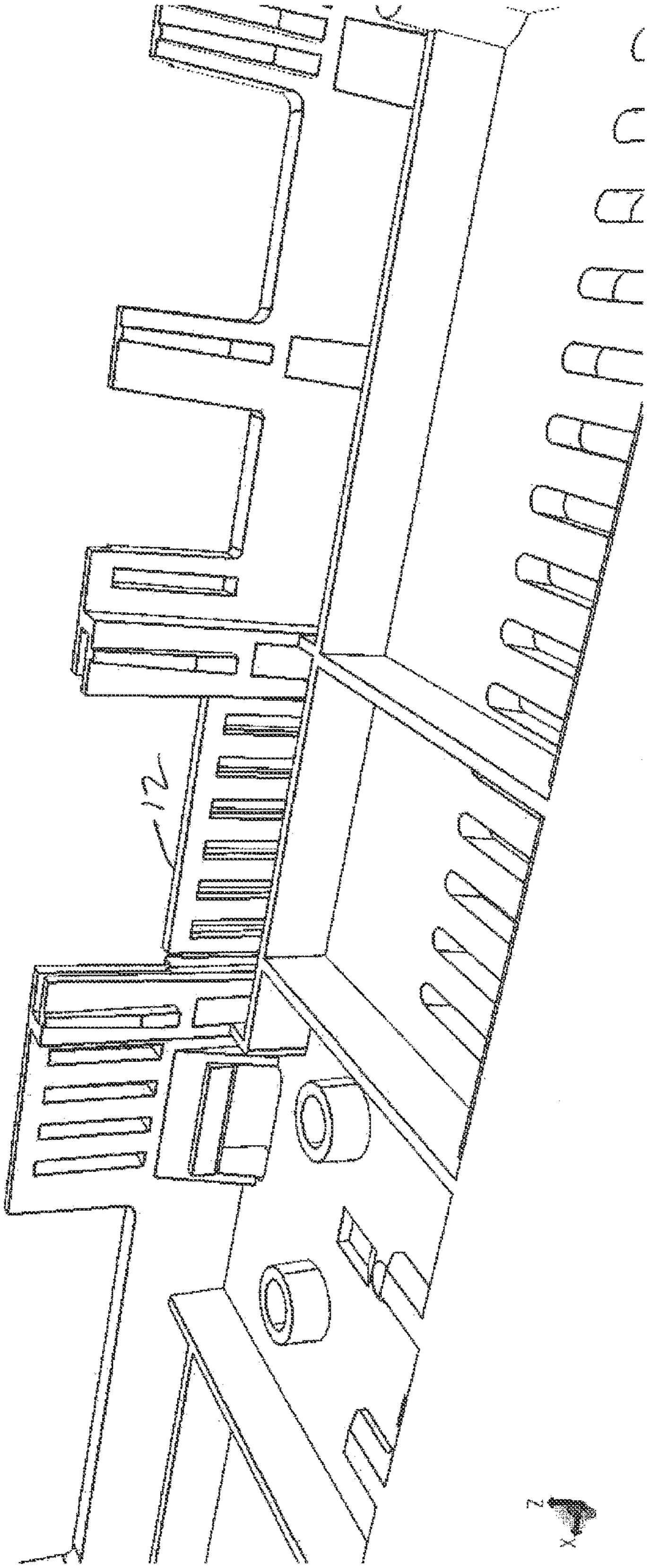
FIG. 15 is a diagram of the view from inside of the controller looking toward the installed door that is at least partially open.
Figure 16:
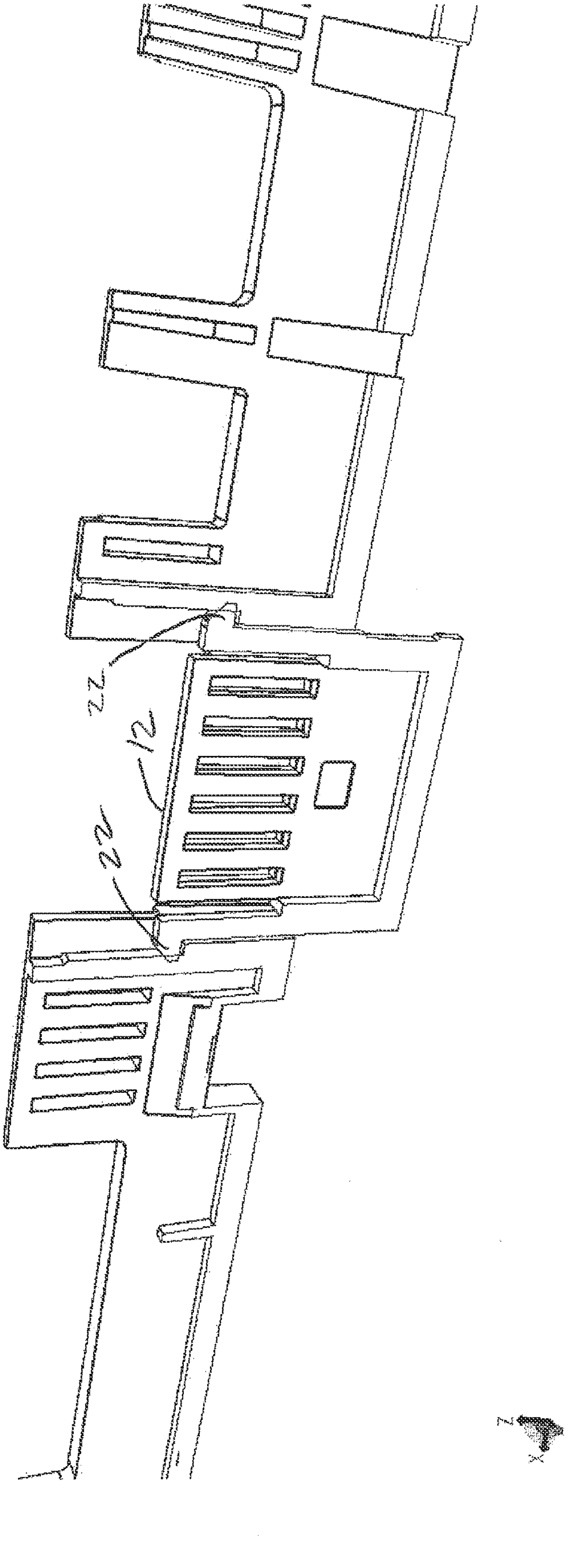
FIG. 16 is a diagram of a view from outside of the controller looking to the installed door that is at least partially open.
Figure 17:
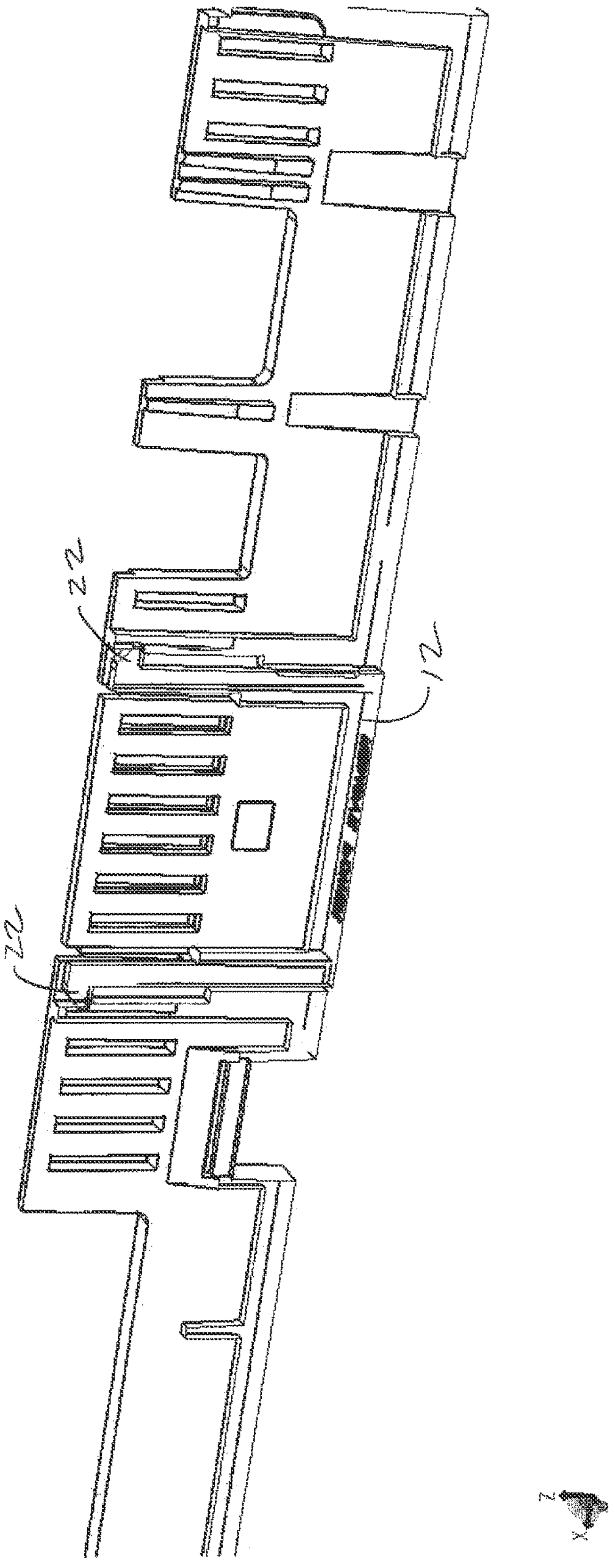
FIG. 17 is a diagram of a view from outside of the controller looking to the installed door that is closed.
Figure 18:
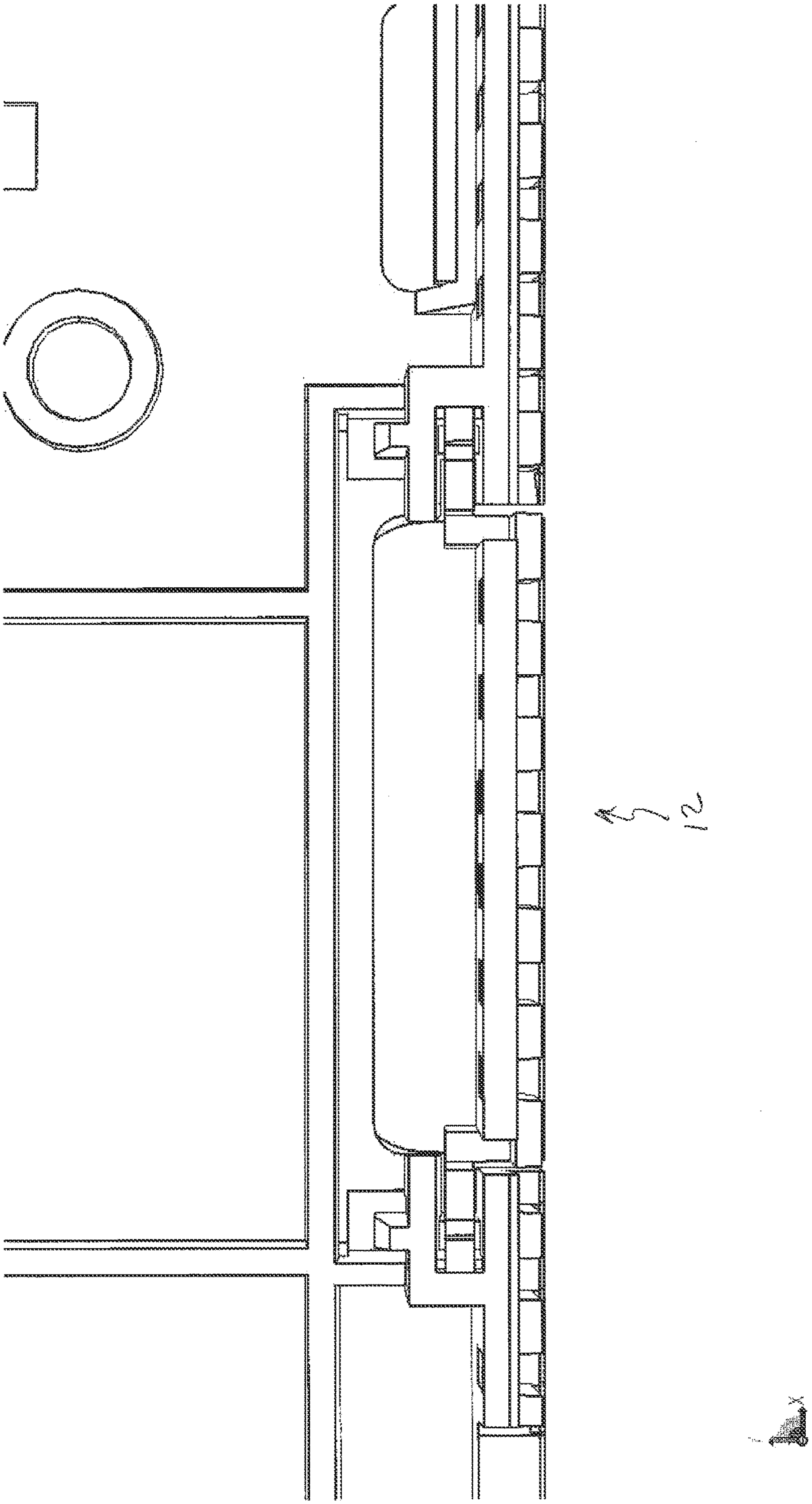
FIG. 18 is a diagram of a view from top of the door situated on the controller.
Figure 19:
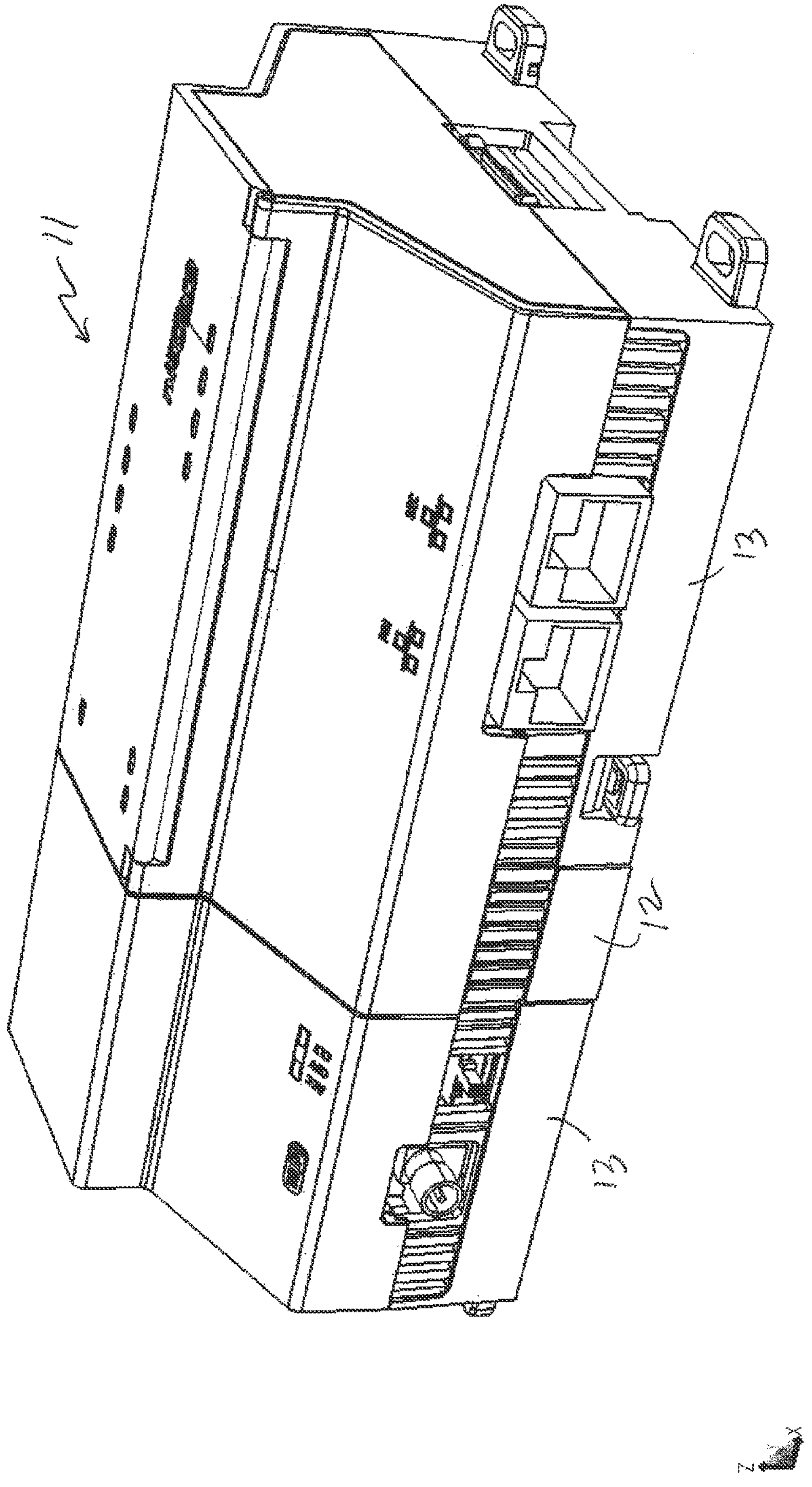
FIG. 19 is a diagram of the controller from a perspective angle with its cover on and having a closed door.
Figure 20:
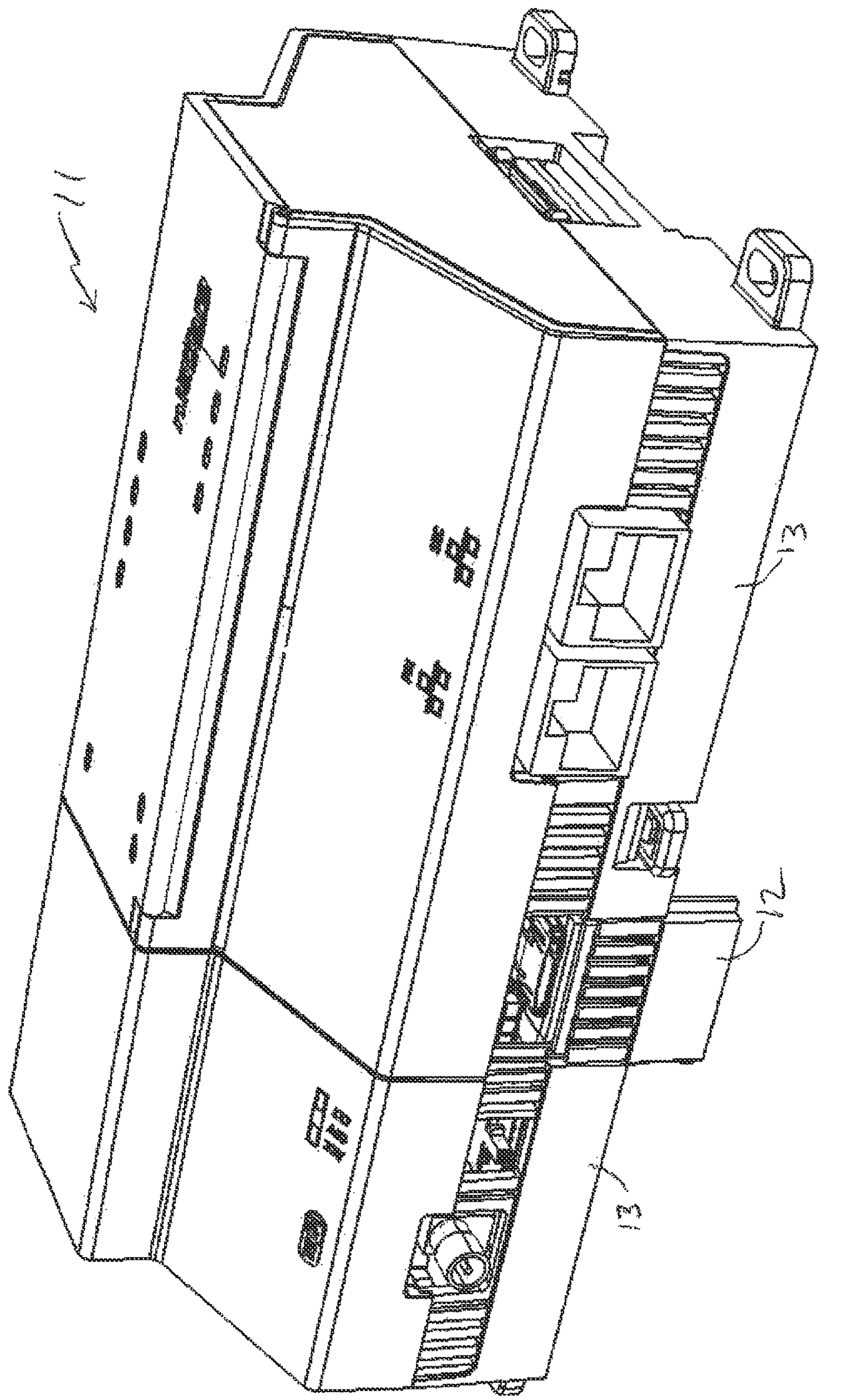
FIG. 20 is a diagram is a diagram controller from another perspective angle than that of FIG. 8 with its cover on, and having an open door without revealing the door's hooks.
Figure 26:
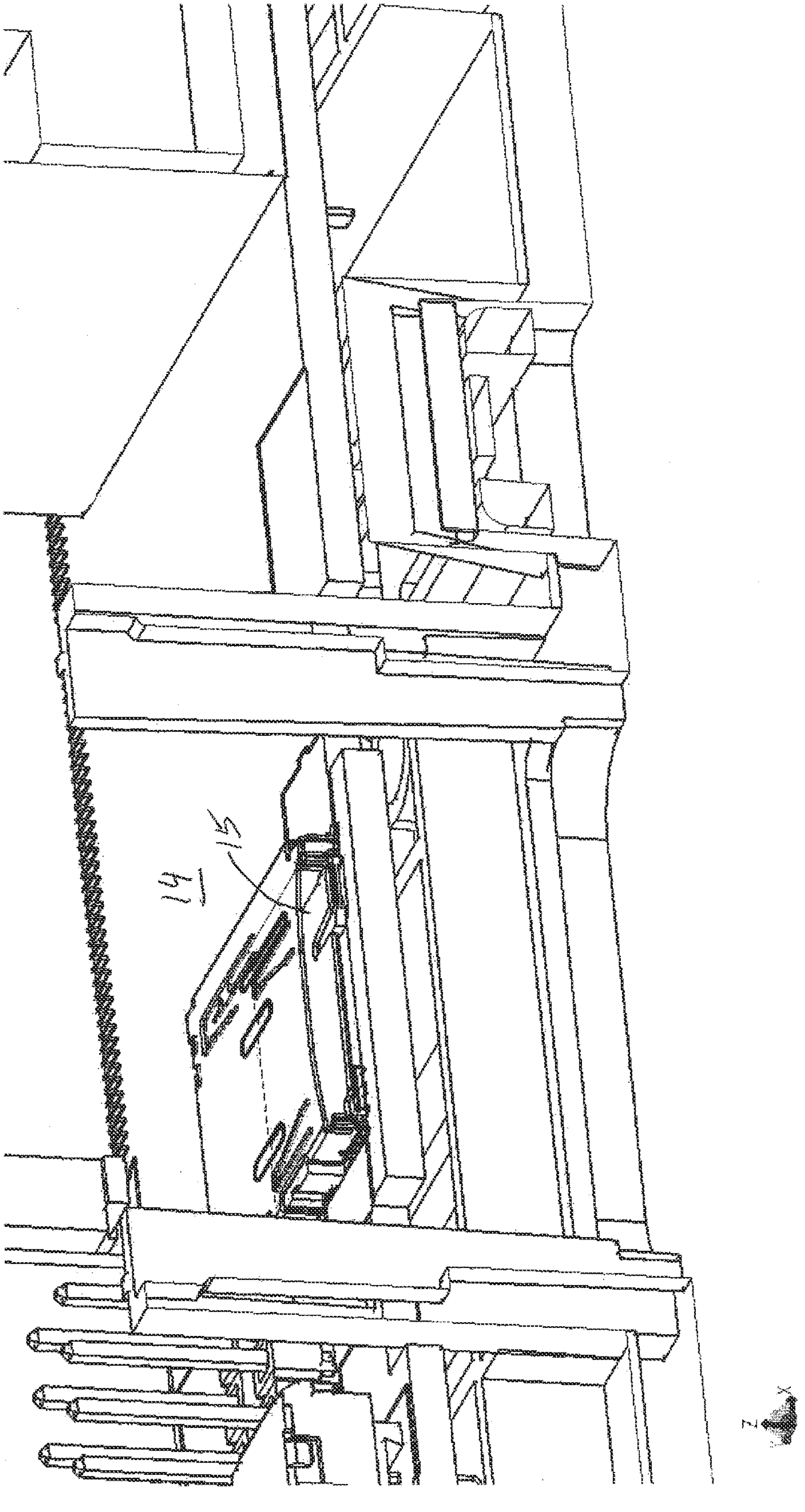
FIG. 26 is a diagram of the controller with the door off and revealing the SD card.

FIG. 7 is a diagram of door 12 with a warning on appendage 16 to remove power before ejecting. FIG. 8 is a diagram of door 12 in an open position on controller 11. FIG. 9 is a diagram of hooks 22 for door 12 on the controller. FIG. 10 is a diagram of the door opening, showing a card 15, on the controller without the hooks for the door. FIG. 11 is a diagram of a perspective view of door 12 free from the controller. FIG. 12 is a diagram of a perspective view of door 12 from another angle. FIG. 13 is a diagram of a view showing a warning message on the bottom or appendage 16 of door 12. FIG. 14 is a diagram of a view from inside of the controller looking to an installed door 12. FIG. 15 is a diagram of the view from inside of the controller looking toward an installed door 12 that is at least partially open. FIG. 16 is a diagram of a view from outside of the controller looking to installed door 12 that is at least partially open. FIG. 17 is a diagram of a view from outside of the controller looking to installed door 12 that is closed. FIG. 18 is a diagram of a view from top of door 12 situated on the controller. FIG. 19 is a diagram of the controller from a perspective angle with its cover on and having a closed door 12. FIG. 20 is a diagram of controller 11 from another perspective angle than that of FIG. 8, with its cover on, and having an open door 12 without revealing the door's hooks. FIG. 26 is a diagram of the controller with door 12 off and revealing an SD card 15 and receptacle 14.

To recap, a holding mechanism for a software device or secure digital card in a controller, may incorporate a receptacle in a controller, and a door that closes or opens an entry to the receptacle. The receptacle may hold a software device or secure digital (SD) card. The door may have slots which line up with slots of the receptacle. When the door closes and opens, the slots may slide along the slots of the receptacle and close off a volume in the receptacle from an external environment of the controller. The door may have hooks that prevent removal of the door when the door is slid to a position of being wholly open.

When the door is in a position of closing off the entry to the receptacle, an outside surface of the door may match up with a surface of the controller or the structure in which the receptacle is situated. The door may have a color that appears like the color on the surface of the controller adjacent to the door. The door may blend in with a structure of the controller surrounding the receptacle in that the door appears virtually invisible to an observer.

The door may have to slide down completely for removal or insertion of the SD card. The controller may have to be removed from a panel, rail or holder that provides a source of power to the controller before the door can be slid down completely. Removal of the controller from the panel, rail or holder may disconnect the power from the controller.

The SD card may have to be fully installed in the receptacle before the door can be closed.

The hooks of the door may be engaged into a structure surrounding the receptacle during assembly.

Qualified controller technicians may be aware of access to the receptacle via the door that is virtually invisible to an observer. The qualified technicians may be qualified by a manufacturer of the controller or by a training facility certified to qualify the technicians.

The door may incorporate an edge upon which a finger or tool can get a grip on the door to slide the door open.

The door may incorporate a portion of an external surface that has a texture that a finger or tool can get a grip on to slide the door open.

An approach for installing or replacing a software device or secure digital card in a controller, may incorporate removing a controller from a location that provides power to the controller to disconnect the power from the controller, opening a door to a receptacle in the controller, installing or replacing a software device or secure digital card through an opening of the door in the receptacle, and closing the door to the receptacle. The door may have one or more hooks that prevent the door from being removed from the controller during the opening and closing the door to the receptacle.

The door may slide open and close adjacent to a surface of the controller. The door may have a surface that is in a same plane of a surface surrounding an opening of the receptacle.

The surface of the door may have a color that is the same as the color of the surface surrounding the opening of the receptacle.

The door may incorporate a backstop to prevent the door from sliding off from the controller in an event that the hooks do not prevent the door from being removed during the opening and closing the door. A specially designed tool may be required to remove the door from the controller.

The door may incorporate a plate or appendage attached to an end of the door. When the door is being closed, the plate may move into a slot of the controller. The plate may have an outer surface that is in a same plane of a surface of the controller that is at a perimeter of the slot within the surface of the controller.

The approach may further incorporate grinding a portion of an external surface of the door to provide a grip surface or a notch for sliding open the door. The approach may further incorporate virtually fully installing the software device or secure digital card before the door can be closed and the controller can be placed in a location that provides power to the controller.

The software device or secure digital card may incorporate a license for operating software in the controller as noted in the license.

A controller having space for a software medium, may incorporate an accessible space in a controller for a storage device, a cover door situated at an entry of the accessible space, and a power disconnect mechanism situated at the cover door and a source of power to the controller. The cover door cannot necessarily be opened sufficiently for placing or removing a device at the accessible space until the source of power to the controller is disconnected.

The cover door may slide on a slide mechanism in the door against a matching slide mechanism in the structure of the controller to close or open at the entry of the accessible space. To close or open at the entry of the accessible space to hold the cover door against the entry, the cover door may have stops that catch on a ledge at the entry of the accessible space to prevent the cover door from coming off the controller. A specially designed tool may be needed to remove the door without damage to the door or the structure of the controller.

The door may have a flat end that touches a surface before the door can open sufficiently for placing or removing a device at the accessible space. The surface may exists to prevent the door from opening sufficiently for placing or removing a device at the accessible space when the source of power is connected to the controller.

The door may incorporate a surface and color that blends with the surface and color of the controller at a perimeter of the entry of the accessible space that makes the door when closed virtually indistinguishable from the controller.

The accessible space may incorporate a connector for one or more storage devices. The one or more storage devices may be selected from a group having software license storage, software program storage, and data storage.

U.S. patent application Ser. No. 11/839,889, filed Aug. 16, 2007, is hereby incorporated by reference. U.S. Pat. No. 8,484,454, issued Jul. 9, 2013, is hereby incorporated by reference. U.S. patent application Ser. No. 13/603,308, filed Sep. 4, 2012, is hereby incorporated by reference. U.S. patent application Ser. No. 14/327,451, filed Jul. 9, 2014, is hereby incorporated by reference.

Any publication or patent document noted herein is hereby incorporated by reference to the same extent as if each individual publication or patent document was specifically and individually indicated to be incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A holding mechanism for a software device or secure digital card in a controller, comprising:

a receptacle in a controller; and a door that closes or opens an entry to the receptacle; and wherein:

the receptacle can hold a software device or secure digital (SD) card;

the door has slots which line up with slots of the receptacle;

when the door closes and opens, the slots of the door slide along the slots of the receptacle and close off a volume in the receptacle from an external environment of the controller;

the door has hooks that prevent removal of the door when the door is slid to a position of being wholly open;

the door has to slide down completely for removal or insertion of the SD card;

the controller has to be removed from a panel, rail or holder that provides a source of power to the controller before the door can be slid down completely; and removal of the controller from the panel, rail or holder disconnects the power from the controller.

2. The mechanism of claim 1, wherein:

when the door is in a position of closing off the entry to the receptacle, an outside surface of the door matches up with a surface of the controller in which the receptacle is situated;

the door has a color that appears like the color on the surface of the controller adjacent to the door; and the door blends in with a structure of the controller surrounding the receptacle in that the door appears virtually invisible to an observer.

3. The mechanism of claim 2, wherein qualified controller technicians are aware of access to the receptacle via the door that is virtually invisible to an observer.

4. The mechanism of claim 2, wherein the door comprises on edge upon which a finger or tool can get a grip on the door to slide the door open.

5. The mechanism of claim 2 wherein the door comprises a portion of an external surface that has a texture that a finger or tool can get a grip on to slide the door open.

6. The mechanism of claim 1, wherein the SD card has to be fully installed in the receptacle before the door can be closed.

7. The mechanism of claim 1, wherein the hooks of the door are engaged into a structure surrounding the receptacle during assembly.

8. A method for installing or replacing a software device or secure digital card in a controller, comprising:

removing a controller from a location that provides power to the controller to disconnect the power from the controller;

opening a door to a receptacle in the controller;

installing or replacing a software device or secure digital card through an opening of the door in the receptacle; and closing the door to the receptacle;

wherein the door has one or more hooks that prevent the door from being removed from the controller during the opening and closing the door to the receptacle; and wherein the door cannot be opened sufficiently for installing or replacing the software device or secure digital card in the receptacle until the controller is removed from the location that provides power to the controller.

9. The method of claim 8, wherein:

the door slides open and closes adjacent to a surface of the controller; and the door has a surface that is in a same plane of a surface surrounding an opening of the receptacle.

10. The method of claim 9, wherein the surface of the door has a color that is the same as the color of the surface surrounding the opening of the receptacle.

11. The method of claim 9, wherein the door comprises a backstop to prevent the door from sliding off from the controller in an event that the hooks do not prevent the door from being removed during the opening and closing the door.

12. The method of claim 9, wherein:

the door comprises a plate attached to an end of the door;

when the door is being closed, the plate moves into a slot of the controller; and the plate has an outer surface that is in a same plane of a surface of the controller that is at a perimeter of the slot within the surface of the controller.

13. The method of claim 9, further comprising:

grinding a portion of an external surface of the door to provide a grip surface or a notch for sliding open the door; and virtually fully installing the software device or secure digital card before the door can be closed and the controller can be placed in a location that provides power to the controller.

14. The method of claim 8, wherein the software device or secure digital card comprises a license for operating software in the controller as noted in the license.

15. A controller having space for a software medium, comprising:

an accessible space in a controller for a storage device;

a cover door situated at an entry of the accessible space; and a power disconnect mechanism situated at the cover door and a source of power to the controller; and wherein the cover door cannot be opened sufficiently for placing or removing a device at the accessible space until the source of power to the controller is disconnected.

16. The controller of claim 15, wherein:

the cover door slides on a slide mechanism in the door against a matching slide mechanism in the structure of the controller to close or open at the entry of the accessible space;

to close or open at the entry of the accessible space to hold the cover door against the entry, the cover door has stops that catch on a ledge at the entry of the accessible space to prevent the cover door from coming off the controller; and the cover door is configured such that a specially designed tool is needed to remove the door without damage to the door or the structure of the controller.

17. The controller of claim 15, wherein:

the door has a flat end that touches a surface before the door can open sufficiently for placing or removing a device at the accessible space; and the surface exists to prevent the door from opening sufficiently for placing or removing a device at the accessible space when the source of power is connected to the controller.

18. The controller of claim 17, wherein the door comprises a surface and color that blends with the surface and color of the controller at a perimeter of the entry of the accessible space that makes the door when closed virtually indistinguishable from the controller.

19. The controller of claim 18, wherein:

the accessible space comprises a connector for one or more storage devices; and the one or more storage devices are selected from a group comprising software license storage, software program storage, and data storage.

* * * * *